(12) United States Patent
Bodini

(10) Patent No.: US 6,215,658 B1
(45) Date of Patent: Apr. 10, 2001

(54) STRUCTURE FOR HOUSING AND HEAT SINKING EQUIPMENT PIECES IN AN AERONAUTIC OR SPACE VEHICLE

(75) Inventor: Amedeo Bodini, Cremona (IT)

(73) Assignee: Negesat di Boer Fabrizio & C.S.N.C. (IT)

( * ) Notice: Subject to any disclaimer, the term of this patent is extended or adjusted under 35 U.S.C. 154(b) by 0 days.

(21) Appl. No.: 09/414,372

(22) Filed: Oct. 7, 1999

(30) Foreign Application Priority Data

Jul. 10, 1998 (IT) .............................................. TO98A0846
Jan. 4, 1999 (IT) .............................................. TO99A0256

(51) Int. Cl.[7] .................................................. H05K 7/20
(52) U.S. Cl. ........................... 361/695; 361/676; 361/677; 361/678; 361/687; 361/688; 361/689; 361/690; 361/694; 361/698; 361/699; 174/16.1; 174/16.3; 165/80.3; 165/80.4; 165/185; 312/223.2; 454/184
(58) Field of Search .................................... 361/679, 687, 361/688–695, 697, 698, 699, 704, 724, 730; 174/35 R, 16.1, 16.3; 165/80.3, 104.33, 122, 80.4, 185; 312/223.1, 223.2; 454/184

(56) References Cited

U.S. PATENT DOCUMENTS

| 3,648,113 | | 3/1972 | Rathjen et al. . | |
|---|---|---|---|---|
| 3,997,819 | | 12/1976 | Eggert et al. . | |
| 5,160,357 | * | 11/1992 | Faber | 55/385.2 |
| 5,202,815 | * | 4/1993 | Le Boennec et al. | 361/695.5 |
| 5,282,114 | * | 1/1994 | Stone | 361/687 |
| 5,309,315 | * | 5/1994 | Naedel et al. | 361/704 |
| 5,525,753 | * | 6/1996 | Mennucci et al. | 361/707 |
| 5,773,755 | * | 6/1998 | Iwatare | 361/695 |
| 5,808,866 | * | 9/1998 | Porter | 361/695 |
| 5,812,373 | * | 9/1998 | Hwang | 361/704 |
| 5,825,621 | * | 10/1998 | Giannatto et al. | 361/701 |
| 5,907,473 | * | 5/1999 | Przilas et al. | 361/699 |
| 5,930,113 | * | 7/1999 | McCann | 361/704 |
| 6,026,565 | * | 2/2000 | Giannatto et al. | 361/701 |

FOREIGN PATENT DOCUMENTS 72 07 677 U  7/1975 (DE) .
42 23 935  1/1994 (DE) .

* cited by examiner

Primary Examiner—Leo P. Picard
Assistant Examiner—Boris L. Chervinsky
(74) Attorney, Agent, or Firm—Paul & Paul

(57) ABSTRACT

Structure for housing and heat sinking active equipment pieces (3; 2) in a space vehicle, comprising a constraining external container (1; 46) containing a cooling gas or a mixture of gases, means for mechanically holding said boxes (3; 2) into the container (1; 46) and a plurality of channels (32) or empty volumes (18), provided between the external surfaces of the active equipment boxes (3; 2) and the means for mechanically holding said boxes, for the circulation of the cooling gas or mixture of gases. (FIG. 4)

21 Claims, 5 Drawing Sheets

STRUCTURE FOR HOUSING AND HEAT SINKING EQUIPMENT PIECES IN AN AERONAUTIC OR SPACE VEHICLE

DESCRIPTION

1. Technical Field

The present invention refers to a structure for housing equipment pieces in a space vehicle, as electronic equipment responsible of the operation of the satellite or payload like signal transponders, television cameras, transmitters.

More particularly the invention refers to a structure for supporting, containment and heat sinking that decreases the mechanical solicitations suffered by said equipment and allows an efficient heat sinking of the electronic components therein contained.

The interior of telecommunication satellites and similar space vehicles is substantially occupied, besides the fuel reservoirs, by a variety of boxes of electronics, that is closed and sealed boxes housing devices and electronic circuits, which must be fixed to the structure of the satellite and electrically connected to each other and to external devices. Said boxes of electronics, generally known as payload, comprise for instance batteries, signal transponders, data handling equipment, converters, etc.

Into the structure of the space vehicle, each box has a fixed position, defined by a certain number of constraints as the dimensions, the heat dissipation, the centre of gravity, the rigidity or the immunity from electromagnetic interference. The boxes are usually connected each other by a plurality of electric conductors or wiring.

2. Background Art

The known systems for lodging and fixing such boxes of electronics into a satellite or similar vehicle have the drawback of subjecting the equipment to amplification load rising by dynamic coupling environment. More particularly, a dynamic coupling is said to exist when a source of force (or acceleration) applies to the satellite a given force or acceleration (input force), and the equipment is subjected to a force or acceleration (output force) that is larger than that of the source. A relatively high level of force (or acceleration) applied to the payload requires the use of special and complex structures for mounting the payload, increasing the overall mass of the satellite and the relative cost.

Moreover if the electronic equipment must dissipate, during the normal operation, large quantities of heat it is necessary to provide, into the inside of the structure that houses the equipment, a system for dissipating the heat and cooling.

A first system normally used for this purpose consists for instance in immersing the sealed equipment in a cooling liquid, interposing some rigid spacers and exploiting the conduction between the liquid and the external walls of the structure through the use of a pump. This method however results often inadequate because of the high weight of the overall system.

A second system provides the transmission of the heat through honeycomb panels, made of aluminium, coupled to the active equipment and therein constrained by means of inserts provided in the same panels.

The thermal power, generated by the electronic active boxes, is therefore conveyed by conduction through a face of the box, normally the face which is in contact with the panels, and, again by conduction, through the honeycomb panels and subsequently radiative eliminated in the empty space.

This solution however presents some drawbacks, the heat exchange surface between the boxes and the honeycomb panels is limited, in fact only one face of the equipment contributes in dissipating the thermal power generated.

Moreover the structural coupling between the boxes of electronics and the external structure is rigid, due to the locking screws of the equipment, originating the problem of the dynamic amplification of the accelerations during the satellite launching and the consequent necessity of over-dimensioning both the containing structures for the electronic components and the assembling method used for the electronic boards into the equipment, therefore increasing the weight, limiting the payload and effectiveness/costs ratio.

Being known that, in order to optimise the costs of a space program, it is necessary to maintain the satellite weight as lower as possible, maximise the heat dissipation of the electronic components and possibly make use of materials and components qualified for terrestrial use, that are conformed to mechanical solicitations and thermal specifications relatively modest, it is therefore necessary to apply new technologies.

SUMMARY OF THE INVENTION

A first object of the present invention it is therefore to provide a structure for the heat exchange, having performances similar to that of the traditional aluminium honeycomb panels, but that can be applied on several faces of the equipment box and which is not rigid, having elastic and shock absorbing properties for dynamically de-coupling the equipment from the containing structure of the satellite.

A second object of the present invention it is to render the mechanical solicitations of a space vehicle lowest possible avoiding every rigid mechanical joint between the equipment boxes and the main structure of the satellite.

Moreover, thanks to the insertion of the electronic equipment in a pressurised hermetic box containing air at terrestrial pressure, and thanks to a forced ventilation system, an efficient heat exchange, between the inside and the outside of the container, is obtained by convection.

These and other objects are reached by the structures according to the present invention, as claimed in the enclosed claims.

DETAILED DESCRIPTION OF THE INVENTION

Figure 1:
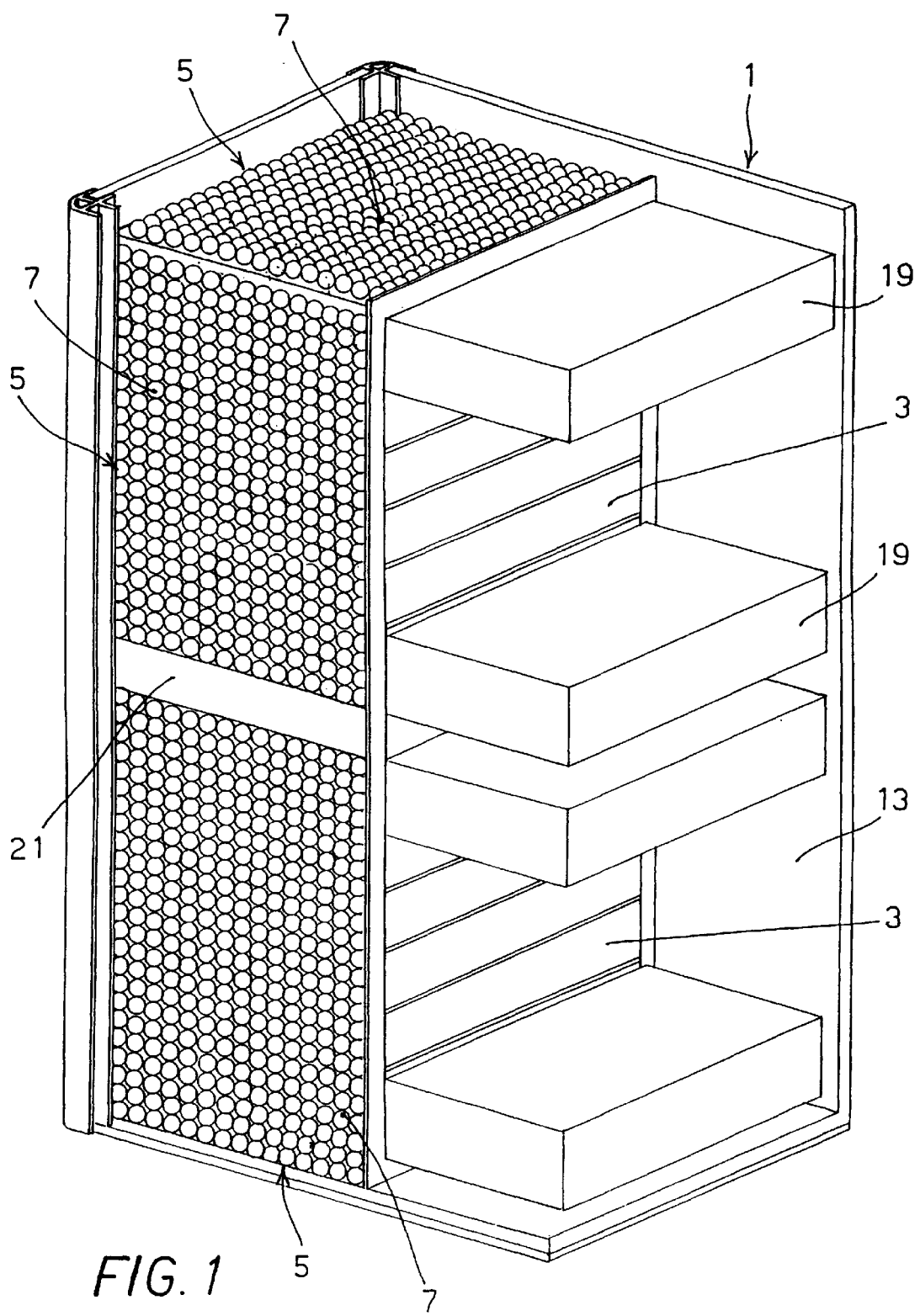
FIG. 1 shows a plurality of equipment housed into an external container comprising a containment and heat dissipation structure realised according to a first embodiment of the present invention.

With reference to FIG. 1 a constraining external container 1 having a parallelepiped shape, suitable for fitting into a satellite or a space vehicle, contains internally a plurality of active equipment boxes 3 connected to each other or to external equipment by means of connectors and electric wiring not shown in figure.

Some elastic-shock absorbing spacers 19, 21 contribute, into the container 1, to maintain the boxes 3 in position and to guarantee a sufficient space for the electric wiring.

Between the inside walls of the external container 1 and the external faces of the active equipment boxes 3 is present a containment and thermal dissipation structure 5 made of a plurality of light elastic-shock absorbing elements covered by a thin (some micron) highly thermal conducting layer (aluminium, copper, silver, gold).

It is supposed, in the case of FIG. 1, that the thermal dissipation happens between equipment and containment structure 1 where the walls are cold (the walls that are not exposed to solar radiance), that is the lateral sides, the back side, the upper and the lower sides. It is also possible to provide the same containment and dissipation structure between the equipment boxes, in case is it advantageous.

Figure 2:
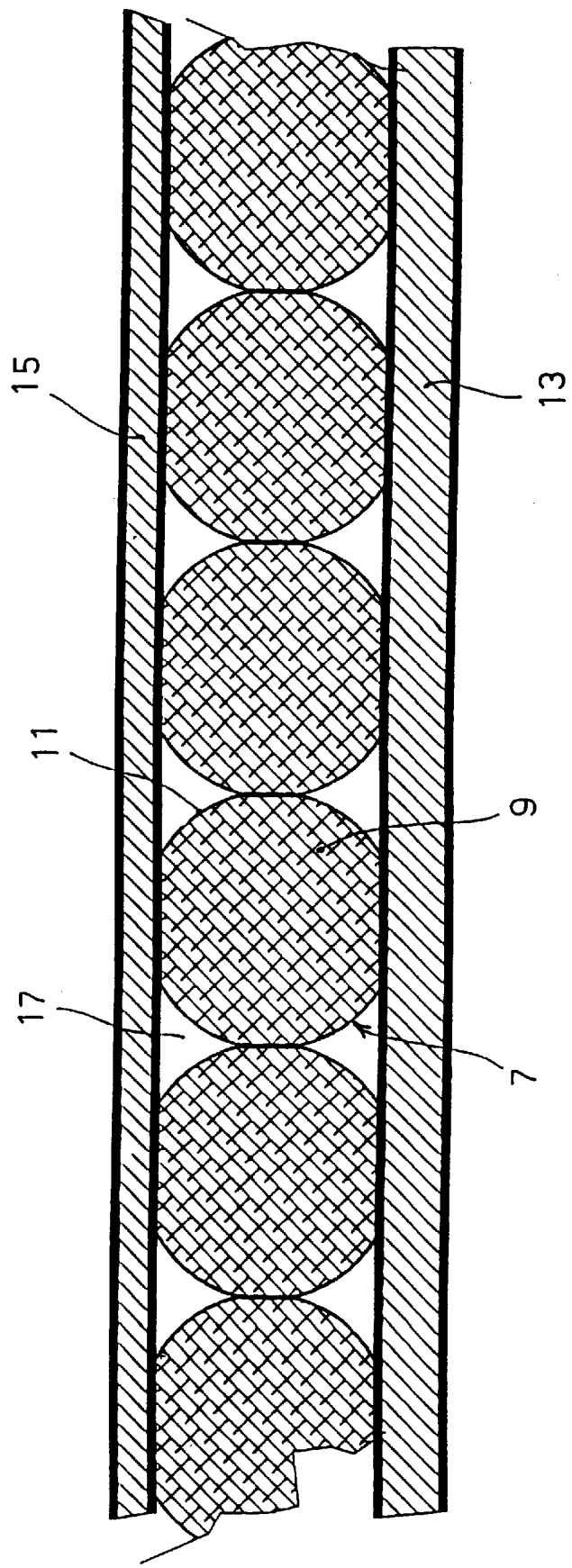
FIG. 2 shows, in a sectional view, a particular of the containment and heat dissipation structure of FIG. 1.

In FIG. 2 it is shown a particular of the containment and thermal dissipation structure.

In the embodiment illustrated the elements 7 have spherical shape and each one is made by a little polystyrene foam ball 9 covered by a film (some micron) of conductive material 11, as for instance aluminium or copper. The balls 7 are applied to more faces of each equipment box 3 and are so compacted in order to maximise the thermal exchange surface between the walls of the equipment 3 and the walls of the container 1.

The covering of the balls could be performed, according to known techniques, both manually and automatically, wrapping the little balls with a thin sheet of copper, aluminium or silver.

The thickness of the conductive film must be such that it does not inhibit the elastic-shock absorbing properties of the polystyrene foam or other internal material. It is acceptable the idea of having more layers of conductive film, the limit being determined by the complete inhibition of the elastic-shock absorbing properties of the inside material.

Alternatively the elements 7 could be cubic, parallelepiped or other shapes, and be analogously covered by a conductive film. The dimensions of the single elements 7 could be chosen according to the needs, small spherical elements are in fact easily inserted in all the void spaces available into the container 1, while elements having greater dimensions, for instance cubes or parallelepipeds, could constrain the boxes in position leaving more space for the circulation of gas or an internal cooling fluid.

The little balls, approached each other and pressed between adjacent walls, form a conductive net having thermal characteristics similar to an aluminium honeycomb panel, maintaining however all the advantages offered by the mechanical properties of the polystyrene foam or other elastic-shock absorbing material.

In FIG. 2, particularly, are visible some balls 7 coupled together and pressed between a wall 13 of the external container 1 and a wall 15 of an equipment box 3. Each ball 7 comprises a core 9 made of an elastic-shock absorbing material and a covering 11 made of a film of aluminium, copper or other conductive material.

The empty spaces 17 comprised between the walls 13 and 15 and between the balls 7 form channels, or empty spaces, for the circulation of a gas or a cooling fluid.

The external container 1 can therefore be pressurised and contain air, an inert gas, a different mixture of gas of cooling or a cooling liquid.

If the container 1 is pressurised the elastic-shock absorbing material could be a closed cell material, like the polystyrene foam, otherwise it is necessary use an open cell material.

It is technically imaginable the use of a closed cell elastic-shock absorbing material also in a vacuum environment, in case this is compacted in the assembling phase in such way that the residual volume that would be occupied in the expansion phase would be insufficient to cause it to explode. If the conductive film also acts as a covering which elastically opposes to the expansion of the closed cell material, this can be used also in the vacuum.

Moreover, if the container 1 is pressurised, the thermal dissipation could be increased introducing, into the same container, some fans, not shown in figures, which start a process of forced ventilation and therefore of convection of the air contained into the container. In absence of gravity in fact the convection would be practically absent.

The inside of the container 1 is maintained at ambient pressure thanks to the sealing made in terrestrial environment using non structural glues, in order to guarantee the seal without jeopardising an eventual accessibility to the inside of the satellite for a last minute rapair.

If, on the contrary, the container 1 is not pressurised a simple heat exchange is obtained, improved by the presence of more thermal conductive faces.

Structurally the configuration is therefore isostatic, being each equipment box constrained by compression on all six faces.

The advantages of this architecture are underlined by the fact that improving, on one side, the dissipative properties of the active boxes and, on the other side, the possibility of designing the assembly and the components for lower load factors, potentially it is possible to use components and assembling methods applied in terrestrial use, having costs much lower then the components qualified for the space vehicles.

Figure 3:
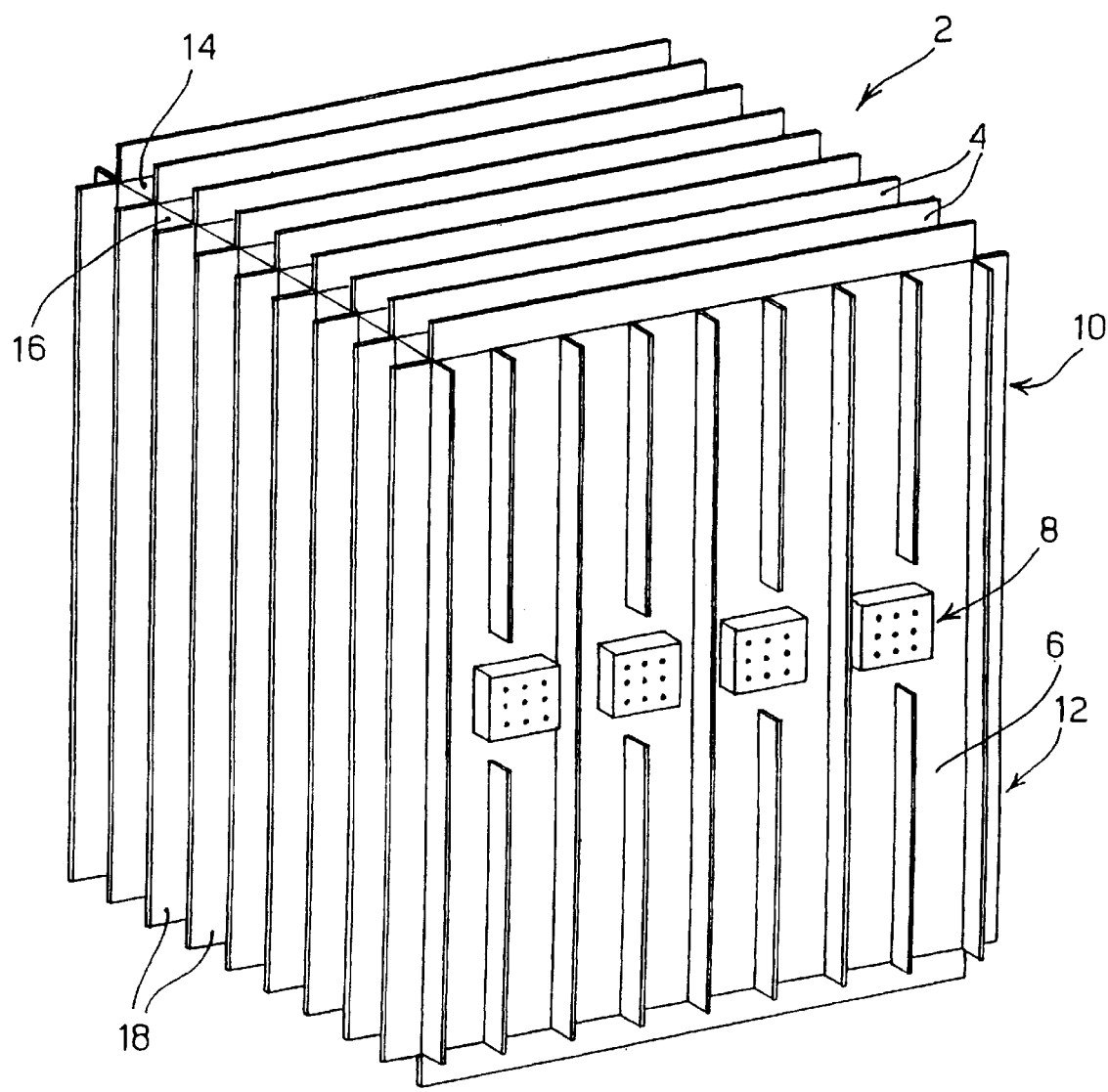
FIG. 3 shows an active equipment box provided, on the external surfaces, of heat sinks having cooling fins, realised according to a second embodiment of the present invention.
Figure 4:
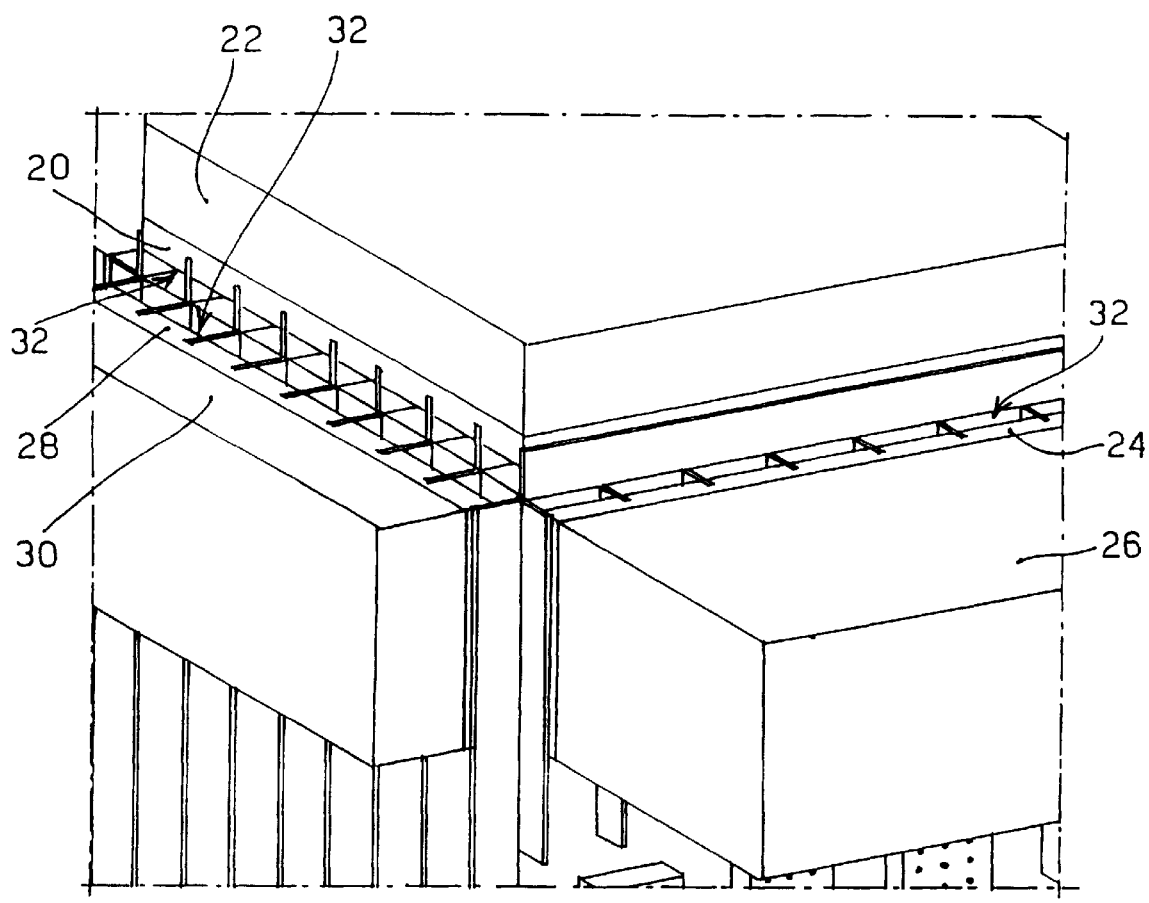
FIG. 4 shows a particular of the box of FIG. 3, equipped with heat sinks and with blocks of plastic shock adsorbing material, realised according to a second embodiment of the present invention.
Figure 5:
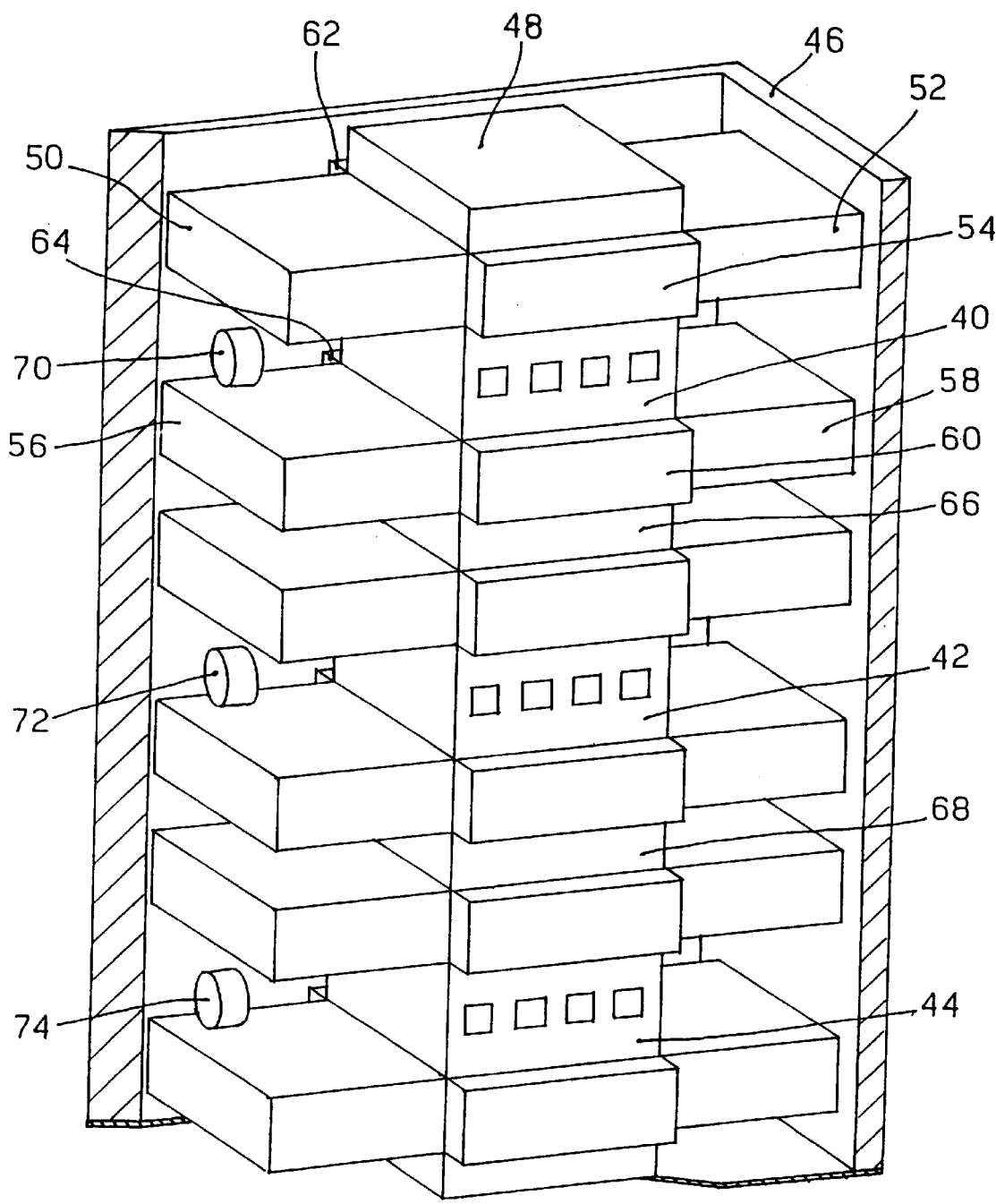
FIG. 5 shows a plurality of boxes inserted into an hermetic container, realised according to a second embodiment of the present invention.

In FIGS. 3, 4 and 5 it is illustrated a second embodiment of the present invention.

With reference to FIG. 3, a box for active equipment or apparatus 2 comprises an external container that for simplicity has parallelepiped shape, but could be of any shape, whose walls are provided with a plurality of heat sinks having cooling fins 4, 10, 12, 18.

The frontal wall is moreover provided with some electric connectors 8 for the connection of the box or apparatus with modules or external parts.

The presence of fins has the double purpose of giving structural rigidity to the box and increasing the thermal dissipation of the same box.

A solution without fins is possible but would be heavier and less thermal efficient.

The structural rigidity of the box can be improved adding some transversal fins, not present in figure, where are not present the spacers or the connectors.

FIG. 3 is not binding neither in the number of connectors nor in their disposition, in fact they could be placed on the side walls as well as on the back wall.

In this structure, almost all the external surface of the box 2 is used for the thermal dissipation of the heat generated internally, as it can be seen in FIG. 4.

In FIG. 4 it is shown a particular of the box of FIG. 5, equipped with blocks or spacers made of elastic-plastic shock adsorbing material coupled to the heat sinks.

Each block comprises two parts glued together, a first part 20, 24, 28 made of rigid plastics is glued to the extremities of the cooling fins and a second part 22, 26, 30 made of polystyrene is glued to the first part.

The blocks therefore rests on the external fins of the box and allow the air flow in the channels 32 between the fins.

Alternatively, in the case of boxes not provided with external fins for the heat dissipation, the channels for the air flow could be obtained on the surface of the blocks which is in contact with the box walls.

FIG. 5 shows a schematic view of a plurality of boxes 40, 42, 44 inserted into an hermetic container 46 and held in position by blocks of elastic-plastic shock adsorbing material.

Alternatively said boxes could be supported by other supporting means, as metallic cables and/or elastic-plastic filler material having a different shape, suitable for maintaining the boxes in position allowing however the circulation of air on part of their external surfaces.

The hermetic container 46 is shown in figure in a partial sectional view in order to allow the vision of the structure contained internally.

Particularly the container 46 comprises three stacked boxes 40, 42, 44 firmly contained between the six internal walls of the container.

A first box 40 comprises an upper block 48 coupled to its upper wall, two side blocks 50, 52, 54, 56, 58, 60, 62, 64 coupled to each side wall, and a lower block 66 coupled to the lower wall.

The blocks have the same structure of the blocks previously illustrated in FIG. 4 and have such dimensions that they can be compressed between the extremities of the cooling fins and the corresponding internal walls of the container or a wall of an adjacent box.

A second box 42, placed in central position between the first 40 and the third box 44, comprises an upper block coupled to its upper wall, which could be the same lower block 66 of the first box 40 or a separate block, two side blocks for each side wall, and a lower block 68.

A third and last box 44 also comprises an upper block, which could be the block 68 of the second box or a dedicated block, two side blocks for each side wall, and a lower block.

The mechanical de-coupling between main structure, the container 46, and the boxes housing the electronic devices, is therefore obtained by means of the aforesaid blocks, or fillers, made of polystyrene, or other equivalent material in terms of elastic-shock absorbing properties, having a proper shape, compressed between the boxes and the main structure in order to obtain an isostatic structure.

Moreover, in order to obtain an efficient thermal dissipation by convection, are used some electric motor fans 70, 72, 74 fixed to an inside wall of the container 46.

Said fans assure a convective flow in the air contained into the container 46, in that in absence of gravity the convection would be practically nothing.

The number of fans must be determined according to the mission and is not therefore binding.

The inside of the container 46 is maintained at ambient pressure thanks to the sealing made in terrestrial environment with non structural glues that guarantee the air-tightness without jeopardising the accessibility to the inside of the satellite for a last minute repair.

The container 46 is normally filled with air but could be also used an inert gas or a different mixture of cooling gases.

This procedure guarantees during all the life cycle of the space vehicle an internal pressure equal to the terrestrial pressure, and it allows therefore to the electronic components, used in the internal equipment of the satellite, to work in an ideal environment, extremely different from the hostile ambient of the thermo-vacuum conditions in which the traditional satellites normally operate.

What is claimed is:

1. Structure for housing and heat sinking active equipment boxes in a space vehicle comprising:
   a constraining external container having a plurality of internal walls, wherein said constraining external container contains a cooling gas or a mixture of cooling gases;
   means for mechanically holding said boxes into said container, wherein said means for mechanically holding said boxes into said container are elements made of elastic-shock absorbing material, each said element being covered by at least one thermal conductive layer and
   a plurality of empty volumes, provided between the external surfaces of said active equipment boxes and said means for mechanically holding said boxes, for the circulation of said cooling gas or mixture of cooling gases.

2. Structure according to claim 1, wherein said elements are applied on one or more faces of each box or between said one or more faces and the internal walls of said constraining external container.

3. Structure according to claim 1, wherein said elements have a shape substantially spherical.

4. Structure according to claim 1, wherein each of said elements have a cubic, parallelepiped or prismatic shape.

5. Structure according to claim 1, wherein said elements are pressed between said one or more face of the boxes and the internal walls of said constraining external container and are coupled together in such a way that they transfer the heat generated by said active equipment towards the walls of the external container.

6. Structure according to claim 1, wherein said elements are covered by a layer of aluminium.

7. Structure according to claim 1, wherein said elements are covered by a layer of copper, silver or gold.

8. Structure according to claim 1, wherein said constraining external container is pressurised and said elastic-shock absorbing material is a closed cell material.

9. Structure according to claim 8, wherein said elastic-shock absorbing material is polystyrene foam.

10. Structure according to claim 8, wherein said pressurised constraining external container comprises internally a forced ventilation system.

11. Structure according to claim 8, wherein said pressurised constraining external container contains a cooling liquid.

12. Structure according to claim 1, wherein said constraining external container is not pressurised and said elastic-shock absorbing material is an open cell material.

13. Structure according to claim 1, wherein said constraining external container is not pressurised and said elastic-shock absorbing material is a closed cell material covered or compressed by a material that prevents its expansion and therefore its explosion.

14. Structure according to claim 1, characterized in that the container is filled with said boxes and sealed in terrestrial environment and that said cooling gas or mixture of gases is air at ambient atmospheric pressure.

15. Structure for housing and heat sinking active equipment boxes in a space vehicle, said boxes being provided, on the external surface, with cooling fins forming empty volumes for the circulation of a cooling gas or mixture of cooling gases, comprising:

a constraining external container having a plurality of internal walls, containing said cooling gas or mixture of cooling gases; and elements, for mechanically holding said boxes into tie container, made of a plurality of blocks of elastic-plastic shock absorbing material, rested against said cooling fins, having such dimensions that they can be compressed between any or all the cooling fins and an adjacent wall of the container, wherein each of said elements is covered by at least one thermal conductive layer.

16. Structure according to claim 15, moreover comprising means for forcing the circulation of said cooling gas or mixture of gases into said empty volume.

17. Structure according to claim 16, characterized in that said elements for forcing the circulation of said cooling gas or mixture of gases into said empty volumes comprise at least a fan operated by an electric motor.

18. Structure according to claim 15, characterized in that each box has polyhedral shape and has on a plurality of faces a plurality of heat sinks provided with cooling fins and a plurality of blocks made of an elastic-plastic shock absorbing material suitable for mechanically holding said box between the walls of the container or between other boxes.

19. Structure according to claim 15, characterized in that said blocks of elastic-plastic shock absorbing material comprise a first part made of rigid plastics glued to the cooling fins and a second part made of polystyrene coupled said first part and pressed against an internal wall of the container or against a block of an adjacent box.

20. Structure according to claim 15, characterized in that said elements for mechanically holding said boxes comprise some spacers made of an elastic-plastic shock absorbing material compressed between the internal walls of the container and elements made of a rigid material interposed between said boxes and said spacers.

21. Structure according to claim 15, characterized in that the container is filled with said boxes and sealed in terrestrial environment and that said cooling gas or mixture of gases is air at ambient atmospheric pressure.

* * * * *